US010306793B2

(12) United States Patent
Coenegracht et al.

(10) Patent No.: US 10,306,793 B2
(45) Date of Patent: May 28, 2019

(54) LONGITUDINAL RADIAL SEAL

(71) Applicant: CommScope Connectivity Belgium BVBA, Kessel-Lo (BE)

(72) Inventors: Philippe Coenegracht, Hasselt (BE); Alexandre Caroline M. De Bie, Beauvechain (BE); Maddy Nadine Frederickx, Aarschot (BE); Paul Joseph Claes, Tremelo (BE); Geert Van Genechten, Vorselaar (BE); Mohamed Aznag, Scherpenheuvel (BE); Diederik Houben, Berbroek (BE)

(73) Assignee: CommScope Connectivity Belgium BVBA, Kessel-Lo (BE)

( * ) Notice: Subject to any disclaimer, the term of this patent is extended or adjusted under 35 U.S.C. 154(b) by 0 days.

(21) Appl. No.: 15/760,204

(22) PCT Filed: Sep. 13, 2016

(86) PCT No.: PCT/EP2016/071522
§ 371 (c)(1),
(2) Date: Mar. 14, 2018

(87) PCT Pub. No.: WO2017/046065
PCT Pub. Date: Mar. 23, 2017

(65) Prior Publication Data
US 2018/0263131 A1 Sep. 13, 2018

Related U.S. Application Data

(60) Provisional application No. 62/218,294, filed on Sep. 14, 2015.

(51) Int. Cl.
*H05K 5/06* (2006.01)
*H05K 5/00* (2006.01)
*H05K 5/02* (2006.01)

(52) U.S. Cl.
CPC ............ *H05K 5/061* (2013.01); *H05K 5/0004* (2013.01); *H05K 5/023* (2013.01); *H05K 5/0221* (2013.01); *H05K 5/0226* (2013.01)

(58) Field of Classification Search
CPC .......... H05K 5/00; H05K 5/0004; H05K 5/02; H05K 5/0221; H05K 5/0226; H05K 5/023; H05K 5/06; H05K 5/061
See application file for complete search history.

(56) References Cited

U.S. PATENT DOCUMENTS 5,277,610 A   1/1994   Krehbeil et al.
6,561,522 B1  5/2003   Radelet et al.
(Continued)

FOREIGN PATENT DOCUMENTS

EP   1 053 419 B1   4/2003
WO   99/41531 A1    8/1999
WO   2014/128137 A2 8/2014

OTHER PUBLICATIONS

International Search Report and Written Opinion of the International Searching Authority for corresponding International Patent Application No. PCT/EP2016/071522 dated Nov. 4, 2016, 8 pages.

*Primary Examiner* — Andrew Jordan
(74) *Attorney, Agent, or Firm* — Merchant & Gould P.C.

(57) ABSTRACT

Aspects and techniques of the present disclosure relate to an enclosure (20) that can include first and second housing pieces (22, 24) that cooperate to define an enclosed interior (26) of the enclosure (20). The first and second housing pieces (22, 24) mate at an interface (28) that extends about a continuous sealing loop (30). The enclosure (20) may include a seal (44) that extends about the continuous sealing loop (30) of the enclosure (20) at the interface (28) between the first and second housing pieces (22, 24). The seal (44) can include a retention portion (46) positioned within a channel (36) of the first housing piece (22) and a sealing flap (Continued)

(48) connected to the retention portion (46). The second housing piece (24) may include an outer flange (50) that extends about the continuous sealing loop (30) of the enclosure (20). The sealing flap (48) of the seal (44) can be compressed between the outer flange (50) and a rim element (32) of the enclosure (20).

13 Claims, 4 Drawing Sheets

(56) References Cited

U.S. PATENT DOCUMENTS

| | | | |
|---|---|---|---|
| 7,441,525 B2 * | 10/2008 | Jessberger | F02F 7/006 |
| | | | 123/193.5 |
| 7,477,826 B2 * | 1/2009 | Mullaney | G02B 6/4471 |
| | | | 385/134 |
| 7,603,018 B2 | 10/2009 | Mullaney et al. | |
| 8,492,651 B2 * | 7/2013 | Schindler | H05K 5/063 |
| | | | 174/50 |
| RE45,951 E * | 3/2016 | Mullaney | G02B 6/4471 |
| 9,400,363 B2 * | 7/2016 | Coenegracht | H02G 15/013 |
| 9,423,029 B2 * | 8/2016 | Coenegracht | H01R 13/508 |
| 9,502,878 B2 * | 11/2016 | Coenegracht | G02B 6/4444 |
| 9,837,754 B2 * | 12/2017 | Coenegracht | H01R 13/508 |
| 2008/0169116 A1 * | 7/2008 | Mullaney | G02B 6/4471 |
| | | | 174/92 |
| 2008/0170832 A1 * | 7/2008 | Mullaney | G02B 6/4471 |
| | | | 385/135 |
| 2017/0012382 A1 * | 1/2017 | Coenegracht | H01R 13/508 |
| 2018/0183175 A1 * | 6/2018 | Coenegracht | H01R 13/508 |
| 2018/0252887 A1 * | 9/2018 | Coenegracht | G02B 6/4444 |
| 2018/0254621 A1 * | 9/2018 | Coenegracht | H02G 3/22 |
| 2018/0263131 A1 * | 9/2018 | Coenegracht | H05K 5/061 |
| 2018/0288288 A1 * | 10/2018 | Romack | H04N 7/185 |

* cited by examiner

LONGITUDINAL RADIAL SEAL

CROSS-REFERENCE TO RELATED APPLICATION

This application is a National Stage Application of PCT/EP2016/071522, filed on Sep. 13, 2016, which claims the benefit of U.S. Patent Application Ser. No. 62/218,294, filed on Sep. 14, 2015, the disclosures of which are incorporated herein by reference in their entireties. To the extent appropriate, a claim of priority is made to each of the above disclosed applications.

TECHNICAL FIELD

The present disclosure relates generally to a sealing arrangement and method, which may be used for forming a seal between two surfaces. More particularly, the present disclosure relates to a longitudinal sealing arrangement that seals in a radial direction.

BACKGROUND

Telecommunications networks often use enclosures for containing and protecting telecommunications equipment (e.g., splice locations, optical splitters, multi-plexers, connection panels, etc.). Enclosures used in outside environments are desirably sealed to prevent moisture intrusion. Gel seals have worked extremely well for providing perimeter seals between bases and covers of enclosures and for providing seals at any other types of interfaces between housing pieces of an enclosure. An example gel sealed enclosure is disclosed at U.S. Pat. No. 7,603,018, International Publication Nos. WO-99/41531, WO-2014/128137 A2. While gel seals are effective for preventing moisture intrusion, such gel seals typically become less effective after the seals have been disrupted or broken a number of times. Therefore, gel seals are often not used to seal components that are intended to be closed and reopened many times. Instead, elastomeric seals such as O-ring seals are often used. A problem with O-ring seals is that such seals often require relatively large clamping forces to ensure adequate sealing.

Most such seals are "axial seals" configured to be compressed in the same orientation as the direction of movement of the housing pieces being sealed. Thus, performance is dependent upon the exact relative position of the housing pieces in the direction of movement of the housing pieces. Typically, multiple latches are positioned around a perimeter of the enclosure to provide the necessary force required to close the cover and bottom pieces together.

EP 1053419 B1 discloses a sealing interface having a shaped elastomeric sealing member that is used to provide a seal between two housing pieces. In use, the elastomeric sealing member forms a "radial seal" within a channel of one of the housing pieces. Radial seals are seals that are compressed in an orientation perpendicular to the direction of movement of the housing pieces being sealed. Other configurations are desirable in the area of radial seals.

SUMMARY

The present disclosure generally relates to a sealing arrangement for use with enclosures including a cover and bottom. The sealing arrangement can be configured to seal the cover and bottom together in a radial direction with minimal force and few latches to close the enclosure.

One aspect of the present disclosure relates to an enclosure including first and second housing pieces that cooperate to define an enclosed interior of the enclosure. The first and second housing pieces mate at an interface that extends about a continuous sealing loop. The first housing piece may define a channel that extends around the continuous sealing loop of the enclosure. The enclosure may include a seal that extends about the continuous sealing loop of the enclosure at the interface between the first and second housing pieces. The seal can include a retention portion positioned within the channel of the first housing piece and a sealing flap connected to the retention portion. The second housing piece may include an outer flange that extends about the continuous sealing loop of the enclosure. The sealing flap of the seal can be compressed between the outer flange and a rim element of the enclosure.

A variety of additional aspects will be set forth in the description that follows. The aspects relate to individual features and to combinations of features. It is to be understood that both the foregoing general description and the following detailed description are exemplary and explanatory only and are not restrictive of the broad inventive concepts upon which the embodiments disclosed herein are based.

DETAILED DESCRIPTION

Figure 1:
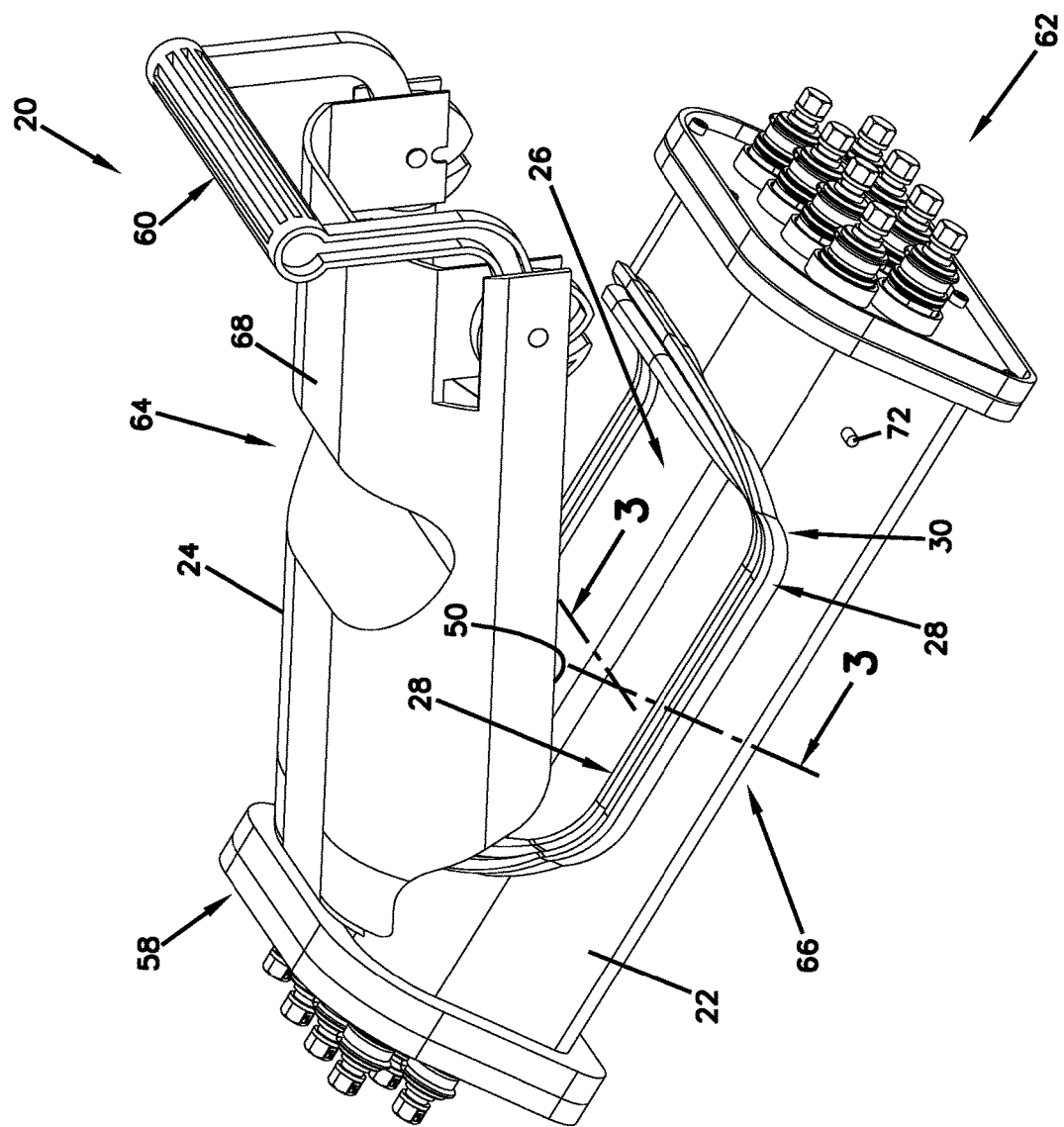
FIG. 1 is a perspective view of an example telecommunications enclosure including a sealing interface in accord with the principles of the present disclosure.

FIG. 1 illustrates a perspective view of an example telecommunications enclosure 20 in accordance with the principles of the present disclosure. The example telecommunications enclosure 20 includes a first housing piece 22 and a second housing piece 24 that together cooperate to define an enclosed interior 26 of the enclosure 20. The first and second housing pieces 22, 24 can mate at a sealing interface 28 that extends about a continuous sealing loop 30. The depicted continuous sealing loop 30 forms a continuous linked seal path which provides for an uninterrupted seal between the first and second housing pieces 22, 24.

The first housing piece 22 is depicted as a base and the second housing piece 24 is depicted as a cover. It will be appreciated that the housing pieces can include housing bodies with a dome or other type of arrangement. Aspects of the present disclosure are applicable to any type of enclosure having housing pieces that fit together and require sealing.

Figure 2:
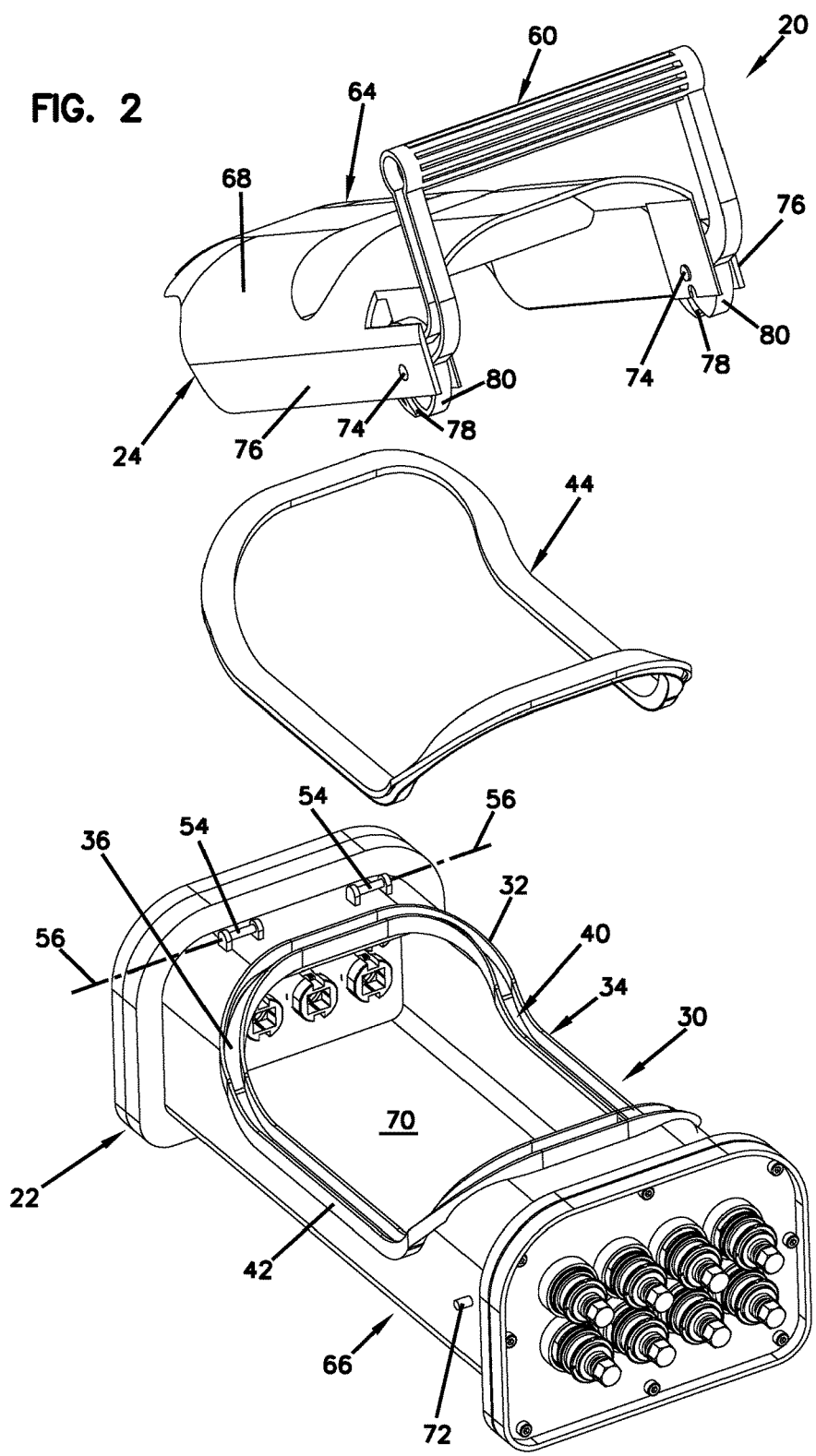
FIG. 2 is an exploded perspective view of the telecommunications enclosure shown in FIG. 1.

Referring to FIG. 2, an exploded perspective view of the telecommunications enclosure 20 is depicted. The first housing piece 22 includes a rim element 32 that extends about the continuous sealing loop 30 of the enclosure 20. The rim element 32 can be configured with a free end 34. The first housing piece 22 defines a channel 36 that extends around the continuous sealing loop 30 of the telecommunications enclosure 20. The channel 36 may be integral with a main body of the first housing piece 22.

In one example, the channel 36 can be positioned laterally inside the rim element 32 and be defined in part by an inwardly facing side 38 of the rim element 32. The channel 36 can have an open end 40 adjacent the free end 34 of the rim element 32. The rim element 32 can also include an outwardly facing side 42. As used herein, inwardly is defined as facing toward the enclosed interior 26 of the telecommunications enclosure 20 and outwardly is defined as facing away from the enclosed interior 26 of the telecommunications enclosure 20.

The example telecommunications enclosure 20 further includes a seal 44 that extends about the continuous sealing loop 30 of the telecommunications enclosure 20 at the sealing interface 28 to form a seal between the first and second housing pieces 22, 24. In certain examples, the seal 44 can be made of a gel or gel impregnated foam. In one example, the seal 44 has an elastic construction and can be made of a rubber or rubber-like material, such as a silicone rubber material. It will be appreciated that other materials having comparable elastomeric characteristics can be used as well.

Figure 3:
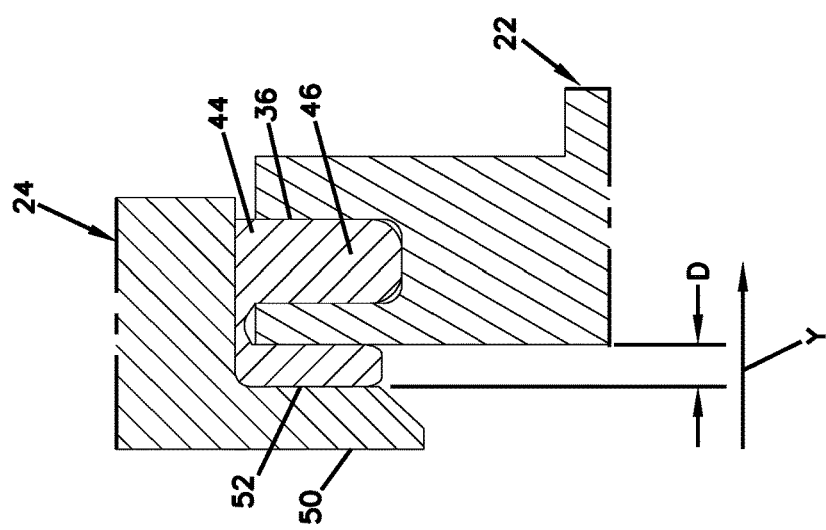
FIG. 3 is a cross-sectional view taken generally along line 2-2, FIG. 1; showing the sealing interface recessed in a first housing piece in a non-sealing state.
Figure 4:
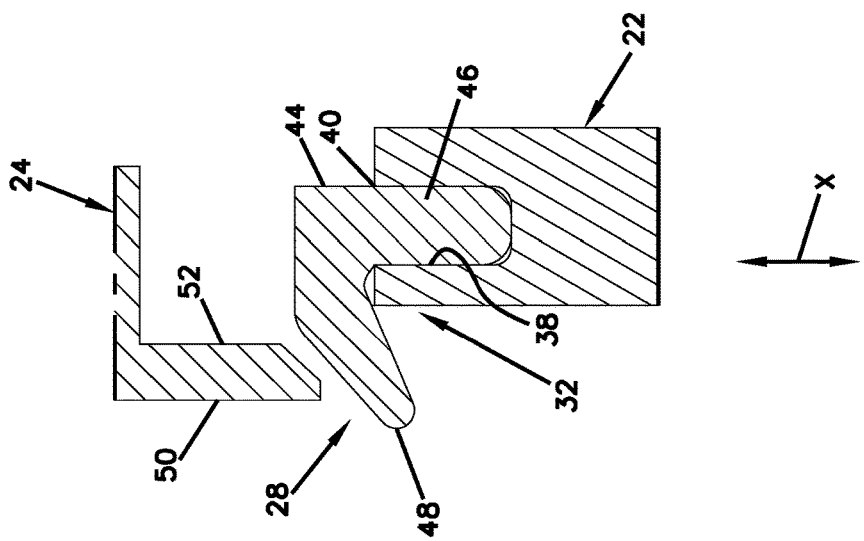
FIG. 4 is a cross-sectional view of the telecommunications enclosure shown in FIG. 1 showing a second housing piece positioned above the sealing interface in a non-sealing state in accord with the principles of the present disclosure.
Figure 5:
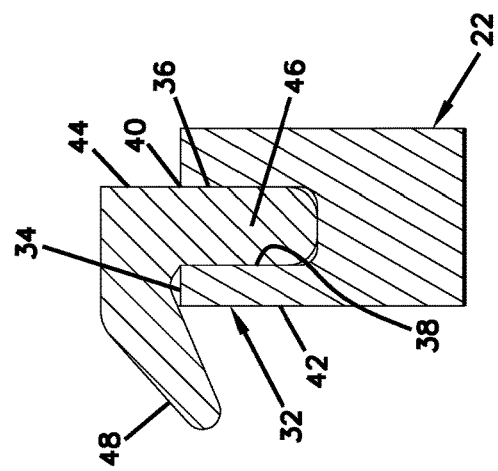
FIG. 5 is a cross-sectional view of the first and second housing pieces mated together at the sealing interface with a seal therebetween in a sealing state in accord with the principles of the present disclosure.

Referring to FIGS. 3-5, a cross-sectional view taken along lines 2-2 of FIG. 1 is shown. The seal 44 includes a retention portion 46 positioned within the channel 36 of the first housing piece 22. The seal 44 can also be configured with a sealing flap 48 connected to the retention portion 46. In one example, the sealing flap 48 can be integral with (e.g., formed in one seamless piece with) the retention portion 46. The sealing flap 48 can be configured to wrap over the free end 34 of the rim element 32 and along the outwardly facing side 42 of the rim element 32.

The second housing piece 24 may include an outer flange 50 that extends about the continuous sealing loop 30 of the telecommunications enclosure 20. The outer flange 50 includes an inwardly facing sealing surface 52 that opposes the outwardly facing side 42 of the rim element 32 when the first and second housing pieces 22, 24 are mated at the sealing interface 28. The sealing flap 48 of the seal 44 can be compressed in a radial direction D between the inwardly facing sealing surface 52 of the outer flange 50 and the outwardly facing side 42 of the rim element 32. As used herein, a radial direction is defined as the direction between the inwardly facing sealing surface 52 of the outer flange 50 and the outwardly facing side of the rim element 32. When the first and second housing pieces 22, 24 are fitted together, the sealing flap 48 is compressed in the radial direction D.

In one example, the first and second housing pieces 22, 24 can have relative movement in a first orientation X when moving between open and closed configurations. In that way, the sealing flap 48 can be compressed in a second orientation Y (i.e., a radial orientation) that is generally perpendicular relative to the first orientation X when compressed between the inwardly facing sealing surface 52 of the outer flange 50 and the outwardly facing side 42 of the rim element 32.

Turning again to FIG. 1, the first and second housing pieces 22, 24 can be pivotally connected together at a hinge 54 (FIG. 2) defining a pivot axis 56 (FIG. 2). As depicted, the first and second housing pieces 22, 24 are pivotally connected together at a first end 58 of the telecommunications enclosure 20 by the hinge 54. The hinge 54 allows the telecommunications enclosure 20 to be opened and closed about the pivot axis 56. A latch 60 (e.g., handle) can be provided at an opposite second end 62 of the telecommunications enclosure 20 for moving the first and second housing pieces 22, 24 to a fully closed and mated position where the seal 44 is fully compressed completely about the continuous sealing loop 30.

The example telecommunications enclosure 20 has a front side 64 and a back side 66 such that the latch 60 can be accessible from the front side 64 of the telecommunications enclosure 20. The second housing piece 24 defines the front side 64 of the telecommunications enclosure 20 including a major front face 68. The first housing piece 22 defines the back side 66 of the telecommunications enclosure 20 including a major back face 70. The latch 60 can be carried with the second housing piece 24 and can be accessible at the major front face 68.

In certain examples, the first housing piece 22 of the telecommunications enclosure 20 can include latch pins 72 that project laterally outwards on opposing sides thereof near the second end 62. The second housing piece 24 can include retention pins 74 that pivotally connect the latch 60 to opposing sidewalls 76 of the second housing piece 24.

The second housing piece 24 can be pivoted down into a staged position with some compression onto the first housing piece 22 such that the latch pins 72 engage cam slots 78 of cams 80 positioned on the opposing sidewalls 76 of the second housing piece 24. The cams 80 can be actuated by moving or rotating the latch 60 relative to the second housing piece 24 to allow the latch pins 72 to ride along the cam slots 78. The cams 80 thereby pull the second housing piece 24 from the staged position to a final position such that the second housing piece 24 is fully compressed against the first housing piece 22. Thus, the latch 60 can provide a final range of pivotal motion to cam the first and second housing pieces 22, 24 together in a sealing state.

The latch 60 and hinge 54 securement arrangement allows for the telecommunications enclosure 20 to be effectively sealed without requiring large clamping forces. In other words, the latch 60 can be actuated with a relatively low latching force to retain the telecommunications enclosure 20 in the fully closed and mated position. By utilizing low forces, the securement arrangement depicted to secure the first and second housing pieces 22, 24 together can be made less robust (e.g., fewer latches can be used). Although one latch is shown, it is understood that in other examples more than one latch may be used.

It will be appreciated that the housing has an elongate configuration with a length that extends along a major axis of the housing and width that extends along a minor axis of the housing. The housing length is longer than the housing width. The housing length extends along a length of the opening surrounded by the perimeter seal and the housing width extends along a width of the opening surrounded by the perimeter seal. The hinge of the cover is located at one end of the housing length and the cam latch or other type of latch is located at the opposite end of the housing length. When closing the cover, the length of the cover is elongated to provide leverage for facilitating closing the cover and pressurizing the perimeter seal. Additionally, as the cover pivots closed, the perimeter seal is gradually pressurized along the length of the housing opening since the cover gradually makes contact with an increased length of the perimeter seal as the cover is pivoted closed. Thus it is not necessary to simultaneously compress the seal along the entire length of the seal perimeter at once. The perimeter seal is fully compressed about its entire perimeter when the cover is pivoted through the last bit of movement before the cover reaches a fully closed position. The cam latch is configured to provide the additional force needed to fully compress the seal and to move the cover through the final range of pivotal movement before the cover reaches the fully closed positon. In one example, a single fastening structure (e.g., latches, clamps, cams, etc.) or multiple fastening structures are only provided at the end of the housing opposite from the hinge. However, in other examples, fastening structures can also be provided at the sides of the housing.

Figure 6:
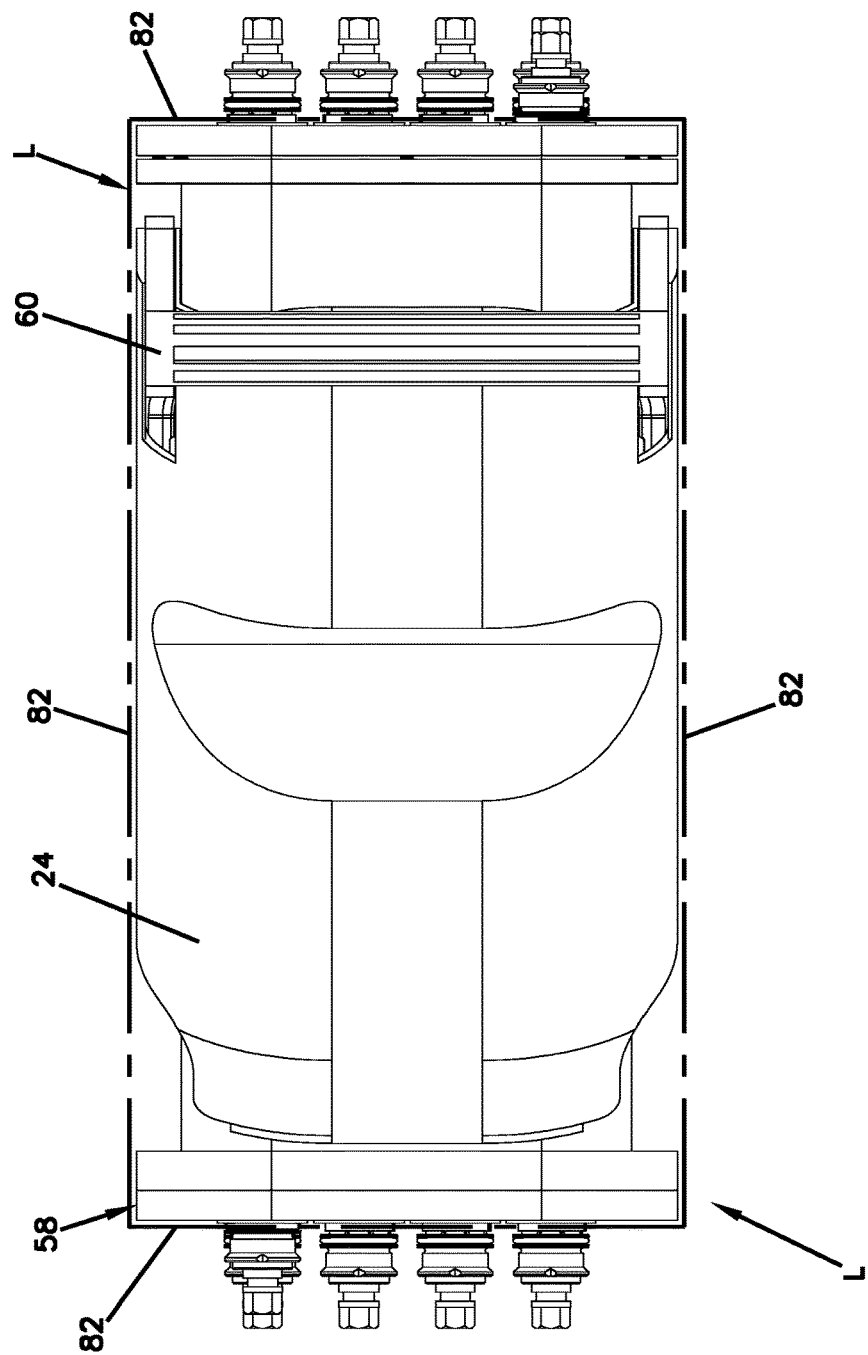
FIG. 6 is a top plan view of the telecommunications enclosure shown in FIG. 1 showing a lateral boundary in accord with principles of the present disclosure.

Referring to FIG. 6, a top plan view of the telecommunications enclosure 20 is shown. As depicted, the latch 60 can be fully contained within a lateral boundary L defined by the telecommunications enclosure 20. In the depicted example, the latch 60 does not project beyond the lateral boundary L defined by the telecommunications enclosure 20. The first and second housing pieces 22, 24 can cooperate to define lateral sides 82 of the telecommunications enclosure 20 which may correspond with the lateral boundary L of the telecommunications enclosure 20.

The latch 60 can be accessed from a top of the telecommunications enclosure 20 such that the latch 60 does not protrude outwardly from a side of the telecommunications enclosure 20. Such an arrangement allows the depicted telecommunications enclosure 20 to be mounted in a compact configuration or next to another enclosure without preventing access to the latch 60.

From the forgoing detailed description, it will be evident that modifications and variations can be made without departing from the spirit and scope of the disclosure.

PARTS LIST

D—Radial direction
X—First orientation
Y—Second orientation
L—Lateral boundary
20—Enclosure
22—First housing piece
24—Second housing piece
26—Enclosed interior
28—Sealing interface
30—Continuous sealing loop
32—Rim element
34—Free end
36—Channel
38—Inwardly facing side
40—Open end
42—Outwardly facing side
44—Seal
46—Retention portion
48—Sealing flap
50—Outer flange
52—Inwardly facing sealing surface
54—Hinge
56—Pivot axis
58—First end
60—Latch
62—Second end
64—Front side
66—Back side
68—Major front face
70—Major back face
72—Latch pins
74—Retention pins
76—Opposing sidewalls
78—Cam slots
80—Cams
82—Lateral sides

What is claimed is:

1. An enclosure comprising:
   first and second housing pieces that cooperate to define an enclosed interior of the enclosure, the first and second housing pieces mating at an interface that extends about a continuous sealing loop, the first housing piece including a rim element that extends about the continuous sealing loop of the enclosure, the rim element having a free end, the first housing piece defining a channel that extends around the continuous sealing loop of the enclosure, the channel being positioned laterally inside the rim element and being defined in part by an inwardly facing side of the rim element, the channel having an open end adjacent the free end of the rim element, the rim element also including an outwardly facing side;
   a seal that extends along at least a portion of the continuous sealing loop of the enclosure at the interface between the first and second housing pieces, the seal including a retention portion positioned within the channel of the first housing piece, the seal also including a sealing flap connected to the retention portion, the sealing flap wrapping over the free end of the rim element and along the outwardly facing side of the rim element; and
   the second housing piece including an outer flange that extends about the continuous sealing loop of the enclosure, the outer flange including an inwardly facing sealing surface that opposes the outwardly facing side of the rim element when the first and second housing pieces are mated at the interface, the sealing flap of the seal being compressed between the inwardly facing sealing surface of the outer flange and the outwardly facing side of the rim element.

2. The enclosure of claim 1, wherein the first and second housing pieces have relative movement in a first orientation when moving between open and closed configurations, and wherein the sealing flap is compressed in a second orientation that is generally perpendicular relative to the first orientation when compressed between the inwardly facing sealing surface of the outer flange and the outwardly facing side of the rim element.

3. The enclosure of claim 1, wherein the first and second housing pieces are pivotally connected together at hinge defining a pivot axis.

4. The enclosure of claim 1, wherein the first and second housing pieces are pivotally connected together at a first end of the enclosure by a hinge, and wherein a latch is provided at an opposite second end of the enclosure for moving the first and second housing pieces to a fully closed and mated position where the seal is fully compressed completely about the continuous sealing loop.

5. The enclosure of claim 4, wherein the latch retains the enclosure in the fully closed and mated position.

6. The enclosure of claim 5, wherein the enclosure includes only a single one of the latch.

7. The enclosure of claim 6, wherein the latch is fully contained within a lateral boundary defined by the enclosure and does not project beyond the lateral boundary defined by the enclosure.

8. The enclosure of claim 7, wherein the enclosure has a front side and a back side, and wherein the latch is accessible from the front side of the enclosure.

9. The enclosure of claim 8, wherein the first and second housing pieces cooperate to define lateral sides of the enclosure which correspond with the lateral boundary of the enclosure, wherein the second housing piece defines the front side of the enclosure including a major front face, wherein the first housing piece defines the back side of the enclosure including a major back face, and wherein the latch is carried with the second housing piece and is accessible at the major front face.

10. The enclosure of claim 4, wherein the enclosure further includes latch pins that project laterally outwards from opposing sides of the first housing piece near the second end.

11. The enclosure of claim 10, wherein the second housing piece includes retention pins that pivotally connect the latch to opposing sidewalls of the second housing piece.

12. The enclosure of claim 11, wherein the latch has a first position such that the latch pins can be received in cam slots of cams positioned on the opposing sidewalls of the second housing piece as the second housing piece is pivoted closed onto the first housing piece.

13. The enclosure of claim 12, wherein the latch is pivoted from the first position to a second position such that the latch pins ride along the cam slots to pull the second housing piece tightly against the first housing piece in a final pivotal motion.

* * * * *